United States Patent [19]

Gerardin

[11] Patent Number: 4,626,676
[45] Date of Patent: Dec. 2, 1986

[54] LIGHT DETECTOR HAVING A PHOTODIODE WITH BIAS CONTROL

[75] Inventor: Jean-Pierre Gerardin, Nanterre, France

[73] Assignee: Electricite de France (Service National), Paris, France

[21] Appl. No.: 779,985

[22] Filed: Sep. 25, 1985

[30] Foreign Application Priority Data

Sep. 28, 1984 [FR] France .................. 84 14980

[51] Int. Cl.[4] ............................... H01J 40/14
[52] U.S. Cl. ..................... 250/214 R; 250/214 RC
[58] Field of Search ........ 250/214 R, 214 RC, 231 R, 250/231 P; 307/311, 297

[56] References Cited

U.S. PATENT DOCUMENTS

| | | | |
|---|---|---|---|
| 3,560,755 | 2/1971 | Massy | 250/214 R |
| 3,911,268 | 10/1975 | Mori et al. | 250/214 R |
| 4,454,418 | 6/1984 | Walker | 250/231 R |
| 4,479,052 | 10/1984 | Suzuki | 250/214 R |
| 4,516,019 | 5/1985 | Eertink et al. | 250/214 RC |

Primary Examiner—David C. Nelms
Assistant Examiner—L. W. Madoo
Attorney, Agent, or Firm—Larson and Taylor

[57] ABSTRACT

The detector comprises an avalanche photodiode for receiving a light beam, a circuit for measuring the mean current across the avalanche photodiode and a bias voltage source. That source is controlled by the circuit for applying to the photodiode a bias voltage such that the mean current across the diode be substantially equal to an adjustable set value.

6 Claims, 2 Drawing Figures

LIGHT DETECTOR HAVING A PHOTODIODE WITH BIAS CONTROL

FIELD OF THE INVENTION

The invention relates to detectors of the type delivering a signal representative of the intensity of a light beam modulated at a frequency which forms a significant parameter to be measured; it more particularly relates to detectors whose photoelectric sensor is an avalanche photodiode receiving the light beam. The invention is particularly suitable for use in detector devices incorporated in apparatus using two beams of coherent light from the same source, one of which is subjected to a physical phenomenon to be studied, which affects the frequency, the two light beams then being mixed on the sensor formed by the photodiode. The intensity of the beam modified by the physical phenomenon is in general small with respect to that of the other beam, called "local oscillator". The intensity of this other beam has often the same order of magnitude as the intensity of the beam delivered by the light source. The photodiode supplies an electric signal having a component at the beat frequency of the two beams.

PRIOR ART

The use of an avalanche photodiode as sensor raises problems. In particular, the nominal or "set" operating point of the photodiode depends not only on the electric bias voltage, which can easily be regulated but also on the light intensity received, that is to say in practice essentially on the intensity of the local oscillator beam and on the temperature. The curve representing the operating characteristic of the photodiode itself depends on its operating point and on its parameters. Now, operation of the photodiode is optimum, more especially in so far as the signal to noise ratio is concerned, when the bias voltage is adjusted to a value just below that which causes the avalanche effect. i.e. is adjusted to a point on the characteristic situated just before the bend thereof. Since operation beyond the bend of the characteristic should be avoided during operation despite inevitable variations, a compromise has been adopted up to now which consists in regulating the bias voltage to a value such that operation is always short of the avalanche zone.

This solution does not allow full use of the possibilities of the avalanche photodiode since the bias voltage will be such that the nominal operating point is substantially below the avalanche zone.

OBJECTS OF THE INVENTION

The invention aims at providing a light detector of the above defined type improved as compared to the prior art detectors, more especially in that it is no longer subjected to the need for the above-mentioned compromise.

SUMMARY OF THE INVENTION

For that, the invention uses the fact that very often the parameter to be measured is not the light energy received by the photodiode but the frequency of modulation of the beam and that consequently the absence of a law of proportionality between light energy received and intensity of the signal supplied by the sensor presents no inconvenience. There is provided consequently a detector of the above defined type comprising a circuit for measuring the mean current flowing through the avalanche diode and means controlled by said circuit applying to the diode a bias voltage such that said mean current is substantially equal to an adjustable reference value. This reference value may be determined experimentally since the avalanche effect results in the appearance of a reverse current in the photodiode, which presents a rapid rise. Thus a signal to noise ratio may be obtained which is practically the best possible.

A limiter is advantageously provided in the means controlled by the measurement circuit so as to avoid giving the bias voltage a value which would shorten the life of the avalanche photodiode.

The invention will be better understood from reading the following description of particular embodiments given by way of non limitative examples.

DETAILED DESCRIPTION OF THE INVENTION

Figure 1:
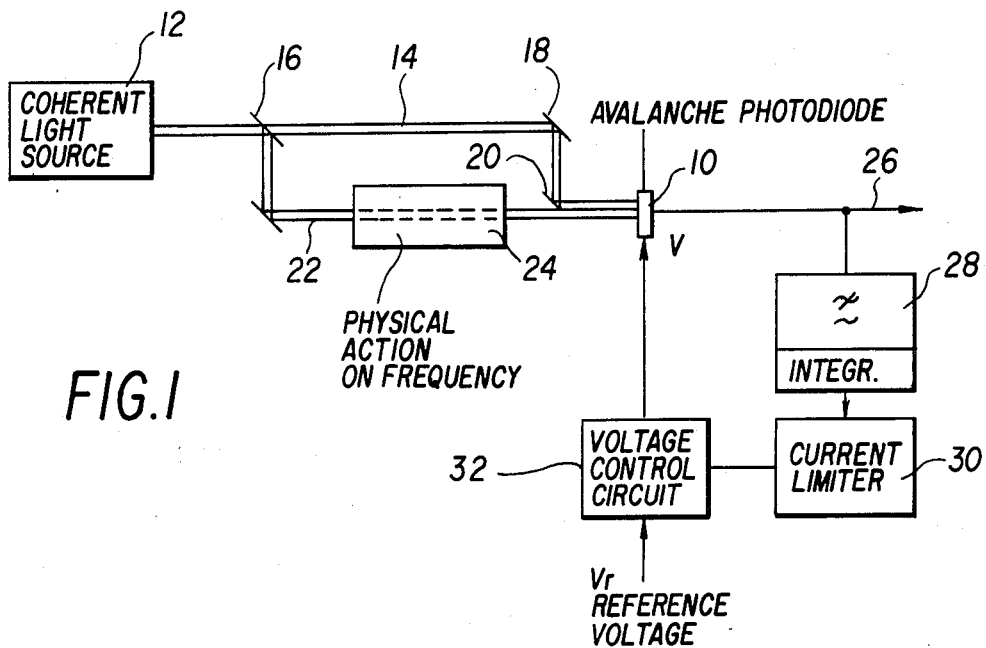
FIG. 1 is a block diagram of a detector device.

The device shown schematically in FIG. 1 forms a heterodyned light detector. This detector comprises a photoelectric sensor formed by an avalanche photodiode 10 which receives the beam. This latter is formed by the superimposition of two components both coming from a coherent light source 12, which will generally be a laser. The first component which may be considered as a local oscillator, transports practically the whole of the energy received by the photodiode 10. In FIG. 1, this component 14 is fed to photodiode 10 from laser 12 by a semi reflecting mirror 16 and mirrors 18 and 20. The energy brought to photodiode 10 by this component obviously depends on the intensity of the beam provided by the laser 12 and on the absorption undergone on its path.

The second component 22 is subjected, at 24, to the action of a physical phenomenon which affects the frequency of the component. This latter transports low power energy, often less by several orders of magnitude than the energy of the local oscillator.

The two components are mixed on the sensitive surface of photodiode 10 which supplies in response, at an output 26, an electric signal which has a component at a frequency equal to the beat frequency of the two components 14 and 22.

The detector comprises a circuit for regulating the operating point of photodiode 10. This circuit is formed by a loop acting on the bias voltage V applied to photodiode 10. The regulating loop may be regarded as comprising a circuit measuring the mean current flowing through the photodiode and means for regulating the bias voltage V.

Circuit 28 for measuring the mean current comprises a low pass filter having a cut off frequency of a few Hz and an integrator. The output current from circuit 28 is applied, in the embodiment shown, to a protection limiter 30 which transmits the current which it receives from circuit 28 to the extent that it does not exceed a given value, which may be adjustable, corresponding to the maximum acceptable bias voltage for photodiode 10. The output current from limiter 30, forming a control signal, is applied to a device 32 for regulating the bias voltage. This device comprises a comparator to which are applied the control signal from limiter 30 and an adjustable reference signal $V_r$ chosen as a function of the reference value of the mean current flowing through the photodiode 10.

Figure 2:
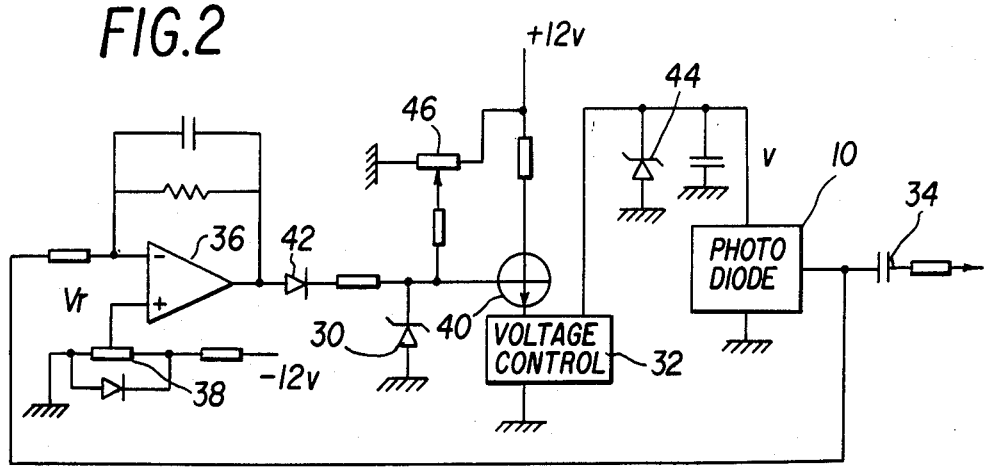
FIG. 2 is a circuit diagram of a regulation loop for such a device according to an embodiment of the invention.

Circuits 28, 30 and 32 may consist of conventional components. FIG. 2 shows a construction of the regulation loop suitable for use with a wide pass-band silicon avalanche photodiode comprising an incorporated preamplifier supplying an output voltage proportional to the current in the photodiode. The components of the loop of FIG. 2 have a different arrangement from that of FIG. 1 but provide an equivalent result. Those of these components which correspond to those of FIG. 1 bear the same reference number.

The output voltage from diode 10 is taken through a capacitor 34 for use as measurement signal. This voltage is applied directly to one of the inputs of a differential servo-control amplifier 36 connected to act as an integrator. The other input of amplifier 36 receives the reference voltage $V_r$ representing the reference value of the mean current flowing through the diode, adjustable by means of a potentiometer 38.

The means for regulating the bias voltage V comprise a high voltage DC/DC converter 32 and a transistor 40 controlling the supply voltage of converter 32. The output signal from the differential amplifier 36 is applied to the base of transistor 40 through a diode 42. A Zener diode 30 forms an input limiter for preventing the input voltage to converter from exceeding a value for which the output voltage would be excessive for photodiode 10. A second Zener diode 44, placed at the output of converter 32, provides additional safety.

To maintain the photodiode in the operating condition, its bias voltage must have a minimum value. If the light flux received by the photodiode undergoes an intense increase, amplifier 36 may lower the voltage below this minimum. To allow operation in this case, the loop comprises an element for maintaining the bias voltage above the minimum. As shown in FIG. 2, this element is formed by a potentiometer 46 connected to the base of transistor 40.

By way of example, it may be mentioned that a regulation loop of the type shown in FIG. 2 has been applied to a photodiode C 30950 of the firm RCA, comprising an incorporated preamplifier and providing a voltage proportional to the diode current. The DC/DC converter was of the type PF 1041 P from RCA, ensuring the proportionality between input and output voltages. The Zener diodes 30 and 44 limited the voltages applied respectively to 4 Volts and 480 Volts.

I claim:

1. A light detector for delivering an electrical measurement signal having signal components at a frequency representative of a frequency present in a light beam, having: an avalanche photodiode for receiving the light beam; source means for applying an adjustable bias voltage to said photodiode, whereby a variable measurement current is delivered by said photodiode; a circuit for measuring a mean value of said measurement current and delivering an output signal representative of said mean value; and means responsive to said output signal and controlling said source means for maintaining said mean value at a predetermined set value lower than that for which the current-voltage characteristic of said avalanche photodiode exhibits a bend.

2. Detector according to claim 1, wherein said converter further comprises voltage adjustment means connected to prevent the output voltage of said converter from lowering beyond a predetermined minimum value by overriding control by said transistor circuit.

3. A measurement assembly having: a light source delivering a light beam; means for separating said light beam into a first fraction and a second fraction and for directing said second fraction along a path where it is subjected to a physical phenomenon to be studied which modifies the frequency of light in said second fraction, said second fraction having an intensity much lower than that of the first fraction; an avalanche photodiode located to receive both said fractions; electrical source means for applying a bias voltage to said avalanche photodiode and causing a light representative current to pass in said photodiode; a circuit for measuring an average value of said current and delivering an electrical output signal representative of said average value; and means responsive to said output signal and arranged for controlling said source means for maintaining said average value at a predetermined set value lower than the current for which the inverse current-voltage characteristic of said photodiode exhibits a bend.

4. Detector according to claim 1, wherein said means responsive to the output signal of said circuit further comprises limiting means arranged for limiting said bias voltage to a predetermined maximum value.

5. Detector according to claim 1, wherein said circuit for measuring the mean value has a low pass filter having a cut-off frequency greater than 1 Hertz and in the 1 Hertz order of magnitude.

6. Detector according to claim 1, wherein said circuit for measuring the mean value comprises an integrating differential amplifier connected to receive an output signal from said photodiode and a reference voltage representing said set value and wherein said means responsive to the output signal of said circuit comprise a DC/DC converter and a transistor circuit having a control input connected to the output of said differential amplifier and an output connected to said converter for controlling said converter.

* * * * *